United States Patent
Wicks

(10) Patent No.: US 11,043,604 B2
(45) Date of Patent: Jun. 22, 2021

(54) LOW DARK CURRENT, RESONANT CAVITY-ENHANCED INFRARED PHOTODETECTORS

(71) Applicant: University of Rochester, Rochester, NY (US)

(72) Inventor: Gary Wicks, Fairport, NY (US)

(73) Assignee: University of Rochester, Rochester, NY (US)

( * ) Notice: Subject to any disclaimer, the term of this patent is extended or adjusted under 35 U.S.C. 154(b) by 34 days.

(21) Appl. No.: 15/745,757

(22) PCT Filed: May 20, 2016

(86) PCT No.: PCT/US2016/033490
§ 371 (c)(1),
(2) Date: Jan. 18, 2018

(87) PCT Pub. No.: WO2017/019158
PCT Pub. Date: Feb. 2, 2017

(65) Prior Publication Data
US 2018/0219110 A1    Aug. 2, 2018

Related U.S. Application Data

(60) Provisional application No. 62/197,684, filed on Jul. 28, 2015.

(51) Int. Cl.
*H01L 31/0224*    (2006.01)
*H01L 31/101*    (2006.01)
(Continued)

(52) U.S. Cl.
CPC .. *H01L 31/022408* (2013.01); *H01L 31/0224* (2013.01); *H01L 31/02327* (2013.01);
(Continued)

(58) Field of Classification Search
CPC ... H01L 31/035272–03529; H01L 31/035236; H01L 31/109;
(Continued)

(56) References Cited

U.S. PATENT DOCUMENTS 4,999,694 A * 3/1991 Austin ................ H01L 31/108
                                                                257/188
5,016,073 A * 5/1991 Elliott ................ H01L 31/101
                                                                257/184
(Continued)

FOREIGN PATENT DOCUMENTS

WO        2014068850 A1    5/2014

OTHER PUBLICATIONS

Elicu et al, "Non-cryogenic operation of HgCdTe infrared detectors", Proc. SPIE 7608, Quantum Sensing and 4anophotonic Devices VII, 760820 (Jan. 22, 2010) (Year: 2010).*
(Continued)

*Primary Examiner* — Errol V Fernandes
*Assistant Examiner* — Jeremy J Joy
(74) *Attorney, Agent, or Firm* — Riverside Law LLP

(57) ABSTRACT

A resonant cavity-enhanced infrared photodetector has an absorber layer disposed between a first transparent layer and a second transparent layer within an optical cavity. The first transparent layer and the second transparent layer have a bandgap which is larger by at least 0.1 eV compared to the absorber layer. Since the bandgaps of the first and second layer are increased relative to the bandgap of the absorber layer, generation of dark current is limited to the absorber layer. The band profiles of the layers had been designed in order to avoid carrier trapping. In one embodiment, the conduction and valence band offsets are configured to allow unimpeded flow of photogenerated charge carriers away from the absorber layer. The photodetector may be a pho-
(Continued)

toconductor, or a photodiode having n-type and p-type layers. In some embodiments, an interface between the absorber layer and a transparent layer is compositionally graded. In other embodiments, one of a conduction band and a valence band of the absorber layer is aligned with an opposite band of a transparent layer so that a photogenerated charge carrier can tunnel from one band of the absorber layer into the opposite band of the transparent layer.

16 Claims, 8 Drawing Sheets

(51) Int. Cl.
H01L 31/109 (2006.01)
H01L 31/105 (2006.01)
H01L 31/0232 (2014.01)
H01L 31/0352 (2006.01)

(52) U.S. Cl.
CPC .... *H01L 31/035236* (2013.01); *H01L 31/101* (2013.01); *H01L 31/105* (2013.01); *H01L 31/109* (2013.01); *H01L 31/1016* (2013.01)

(58) Field of Classification Search
CPC ....... H01L 31/103–1037; H01L 31/105–1055; H01L 31/0224–022408; H01L 31/101
See application file for complete search history.

(56) References Cited

U.S. PATENT DOCUMENTS

| | | | | |
|---|---|---|---|---|
| 6,740,908 B1* | 5/2004 | Giboney | ......... | H01L 31/022408 257/185 |
| 7,700,969 B1* | 4/2010 | Schulman | ............. | H01L 29/205 257/104 |
| 7,829,915 B2* | 11/2010 | Shi | .................... | H01L 31/02027 257/186 |
| 8,004,012 B2* | 8/2011 | Klipstein | .............. | H01L 31/101 257/196 |
| 8,265,582 B2* | 9/2012 | Takahashi | ........... | H01L 29/7787 455/252.1 |
| 9,882,080 B2* | 1/2018 | Chacinski | ......... | H01L 31/03042 |
| 2002/0027238 A1* | 3/2002 | Lin | ................. | H01L 31/035236 257/292 |
| 2002/0050592 A1* | 5/2002 | Kakinuma | ............ | H01L 31/101 257/53 |
| 2003/0089958 A1* | 5/2003 | Gutierrez-Aitken | ......... | H01L 31/03046 257/458 |
| 2005/0167709 A1* | 8/2005 | Augusto | ........... | H01L 27/14643 257/292 |
| 2009/0261442 A1* | 10/2009 | Grein | ..................... | B82Y 20/00 257/442 |
| 2010/0006822 A1* | 1/2010 | Ting | ...................... | H01L 31/101 257/21 |
| 2010/0072514 A1* | 3/2010 | Ting | ...................... | H01L 31/109 257/184 |
| 2014/0312303 A1* | 10/2014 | Klipstein | ........ | H01L 31/035209 257/21 |
| 2015/0287869 A1* | 10/2015 | Ishibashi | .......... | H01L 31/03046 257/435 |
| 2015/0295108 A1* | 10/2015 | Wei | ................. | H01L 31/035272 257/21 |
| 2016/0240718 A1* | 8/2016 | Giziewicz | ............ | H01L 31/184 |

OTHER PUBLICATIONS

Grein et al, "Non-cryogenic operation of HGCdTe infrared detectors", Proc. SPIE 7608, Quantum Sensing and Nanophotonic Devices VII, 760820 (Jan. 22, 2010) (Year: 2010) (Year: 2010).*
Grein etal, "Non-cryogenic operation of HGCdTe infrared detectors", Proc. SPIE 7608, Quantum Sensing and Nanophotonic Devices VII, 760820 (Jan. 22, 2010) (Year: 2010).*
Velicu et al, "Non-cryogenic operation of HgCdTe infrared detectors", Proc. SPIE 7608, Quantum Sensing and Nanophotonic Devices VII, 760820 (Jan. 22, 2010).
Arnold et al, "Resonant-cavity-enhanced photodetectors for the mid-infrared", Appl. Phys. Lett. 87, 141103 (2005).
Whener, et al, "Mercury cadmium telluride resonant-cavity-enhanced photoconductive infrared detectors", Appl. Phys. Lett. 87, 211104 (2005).
Das, et al. "A model for the performance analysis and design of waveguide p-i-n photodetectors", Electron Devices IEEE Transactions on, vol. 52, No. 4, pp. 465-472, 2005.
Ünlü et al., "Resonant cavity enhanced photonic devices", Journal of Applied Physics 78, 607 (1995).

* cited by examiner

LOW DARK CURRENT, RESONANT CAVITY-ENHANCED INFRARED PHOTODETECTORS

CROSS-REFERENCE TO RELATED APPLICATIONS

This application is a U.S. national phase application filed under 35 U.S.C. § 371 claiming benefit to International Patent Application No. PCT/US16/33490, filed May 20, 2016, which is entitled to priority under 35 U.S.C. § 119(e) to U.S. Provisional Patent Application No. 62/197,684, filed Jul. 28, 2015, each of which application is hereby incorporated herein by reference in its entirety.

STATEMENT REGARDING FEDERALLY SPONSORED RESEARCH OR DEVELOPMENT

This invention was made with government support under Proposal Number 60124 EL, Code W911NF awarded by the Army Research Office. The government has certain rights in the invention.

BACKGROUND

Optical detector structures known as a resonant cavity-enhanced photodetectors (RCE PDs) are known in the art. Conventional RCE PD's consist of a thin absorbing semiconductor layer inserted into larger bandgap semiconductor layers, all of which is in an optical cavity formed by mirrors above and below the absorber and larger bandgap layers. RCE PD's work well as originally designed for near infrared (IR), visible, or ultra-violet where dark current (and its associated noise) is insignificant. However, at the longer wavelengths beyond the near IR, roughly wavelengths greater than 2 microns, dark current is a very significant issue, and conventional RCE PD designs are not good solutions. At these longer wavelengths, conventional RCE PDs can be designed to have both low dark current or high photoresponse, however conventional RCE PDs are lacking a design to have both. The conventional RCE PD has the transparent layers' bandgap only slightly larger than that of the absorber. This avoids trapping of photogenerated current carriers in the absorber, and produces good photoresponse, however dark current is large because it is generated throughout the whole optical cavity (absorber layer and the two transparent layers). On the other hand, if the transparent layers' bandgap is significantly larger than that of the absorber, dark current is reduced to only that which is generated in the thin absorber, however photogenerated carriers are trapped in the absorber, which produces low photoresponse.

A representative conventional RCE PD is shown in prior art FIG. 1. The conventional RCE PD includes a semiconductor photodetector absorber layer inserted between two transparent semiconductor layers, all of which comprises an optical cavity that is located between top and bottom mirrors. The top line (bottom of conduction band) and the bottom line (top of valence band) show the band edges of the semiconductor material that makes up the optical cavity. The absorber layer converts recirculating light into conduction band electrons and valence band holes, which move by drift or diffusion, creating a photocurrent. Within the optical cavity, the recirculation of the light creates two important effects. The re-circulating light interferes with itself, and only certain wavelengths (integer multiples of cavity half-lengths) interfere constructively, thereby creating a narrow spectral bandwidth photoresponse. Also, since the light has many passes through the absorber, the absorber layer has many chances to absorb the light so it can be much thinner than in simpler detectors, while still absorbing a large fraction of the incident light, thereby enabling a large photoresponse, i.e., large quantum efficiency. A small electric field is shown across the optical cavity in FIG. 1, represented by the tilted energy bands. This field distribution is typical of a conventional photoconductive detector. Other field distributions can also be implemented in conventional RCE PD's, for example by implementing a photovoltaic detector (pn photodiode) in the RCE PD. As shown in FIG. 1, conventional RCE PDs are designed with the bandgap energy of the transparent layers being only slightly larger than that of the absorber. Conventional design constraints dictate that the active layer material must have a smaller bandgap than the mirror and cavity materials, but not so much smaller that large heterojunction band offsets hinder the extraction of photogenerated carriers (see for example M. Selim Unlu et al., Journal of Applied Physics, 78, 607 (1995)). This design constraint of conventional RCE PDs, requiring that the layers in the optical cavity must have similar bandgap sizes (a typical difference is <0.1 eV), enables conventional versions of RCE PDs to have high responsivity (an advantage), but does not enables reducing the dark current and its associated noise (a disadvantage).

What is needed in the art is an infrared photodetector that both reduces dark current and enables a high photoresponse, while maintaining the narrow spectral response characteristic of RCE PD's. Low dark current is accomplished by choosing the transparent layers to have bandgaps much greater (>0.1 eV) than that of the absorber. In such RCE PD's, in order to obtain high photoresponse, special designs must be implemented to enable efficient extraction of photogenerated electrons and holes.

SUMMARY

In one embodiment, an infrared photodetector includes an absorber layer disposed between a first layer and second layer having bandgap differences with respect to the absorber of at least 0.1 eV; where a conduction band edge energy of the first layer is less than or within 0.1 eV of a conduction band edge energy of the absorber layer, and a valence band edge energy of the second layer is greater than or within 0.1 eV of a valence band edge energy of the absorber layer. In one embodiment, the first and second layers are substantially transparent. In one embodiment, an electric field throughout an optical cavity of the infrared photodetector is substantially constant. In one embodiment, a slope of the conduction and valence band edges is substantially constant in each layer. In one embodiment, a slope of the conduction and valence band edges is substantially constant in the first layer and variable in the second layer. In one embodiment, a slope of one of the conduction and valence band edges transitions from substantially constant to variable. In one embodiment, a slope of the conduction and valence band edges is substantially the same in one layer and different in another layer. In one embodiment, the first layer is one of an n-type layer and a p-type layer. In one embodiment, the absorber layer is one of an n-type layer and a p-type layer. In one embodiment, the second layer is one of an n-type layer and a p-type layer, and different than the first layer. In one embodiment, doping of the absorber layer is greater than doping of the second layer. In one embodiment, each of the first and second layers and the absorber layer are made from at least one of a binary compound, a ternary compound, a quaternary compound, or a superlattice material. In one embodiment, an interface between the absorber layer and one of the first and second layers is compositionally graded. In one embodiment, a first metal contact is attached to a first exposed edge of the absorber layer. In one embodiment, the photodetector is configured to extract at least one of an electron or a hole laterally out of the absorber layer. In one embodiment, a second metal contact is attached to a second exposed edge of the absorber layer, and the second exposed edge opposes the first opposed edge.

In one embodiment, an infrared photodetector includes an absorber layer disposed between a first transparent layer and second transparent layer having bandgap differences with respect to the absorber of at least 0.1 eV; where either the conduction band or the valence band of the absorber layer is aligned with an opposite band of a transparent layer so that a photogenerated current carrier can tunnel from one band of the absorber layer into the opposite band of the transparent layer. In one embodiment, the absorber's current carrier is an electron. In one embodiment, a conduction band of the absorber layer and a valence band of the first transparent layer are aligned so that the electron in the conduction band of the absorber layer can escape by tunneling into the valence band of the first transparent layer. In one embodiment, the absorber's current carrier is a hole. In one embodiment, a valence band of the absorber layer and a conduction band of the second transparent layer are aligned so that the hole in the valence band of the absorber layer can escape by tunneling into the conduction band of second first transparent layer.

In one embodiment, an infrared photodetector includes an absorber layer disposed between a first transparent layer and a second transparent layer having bandgap differences with respect to the absorber of at least 0.1 eV; where conduction and valence band offsets are configured to allow unimpeded flow of photogenerated charge carriers away from the absorber layer. In one embodiment, an interface between the absorber layer and one of the first and second transparent layers is compositionally graded.

BRIEF DESCRIPTION OF THE DRAWINGS

The foregoing purposes and features, as well as other purposes and features, will become apparent with reference to the description and accompanying figures below, which are included to provide an understanding of embodiments and constitute a part of the specification, in which like numerals represent like elements, and in which.

DETAILED DESCRIPTION

Figure 1:
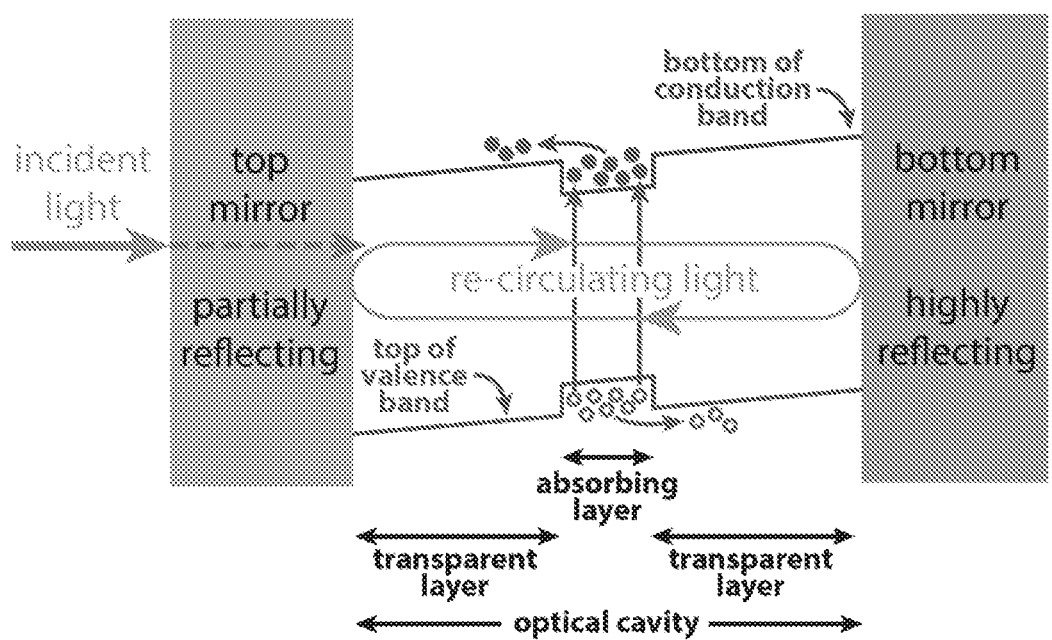
FIG. 1 is a band diagram illustrating the structure of a conventional RCE PD. The conduction and valence band edges of the semiconductor material that make up the optical cavity are shown. The absorber layer and the two transparent layers have band edges that differ by only a small amount, which avoids trapping photogenerated carriers in the absorber layer but creates substantial dark current generation in the transparent layers as well as in the absorber.

It is to be understood that the figures and descriptions have been simplified to illustrate elements that are relevant for a more clear comprehension, while eliminating, for the purpose of clarity, many other elements found in low dark current resonant cavity-enhanced infrared photo detectors. Those of ordinary skill in the art may recognize that other elements and/or steps are desirable and/or required in implementing the systems and methods described herein. However, because such elements and steps are well known in the art, and because they do not facilitate a better understanding of the embodiments, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which embodiments belongs. Although any methods and materials similar or equivalent to those described herein can be used in the practice or testing of the embodiments, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

"RCE PD" as used herein means resonant cavity-enhanced photodetector.

Ranges: throughout this disclosure, various aspects can be presented in a range format. It should be understood that the description in range format is merely for convenience and brevity and should not be construed as an inflexible limitation on the scope. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Referring now in detail to the drawings, in which like reference numerals indicate like parts or elements throughout the several views, in various embodiments, presented herein is a low dark current resonant cavity-enhanced infrared photodetector. Embodiments disclosed herein describe detector designs that reduce dark current by limiting its generation to the thin absorber layer, while simultaneously avoiding carrier trapping the in absorber, enabling high photoresponse. Additionally, the narrow spectral response, which is characteristic of all RCE PD's, remains in these new designs.

In certain embodiments, the infrared photodetectors have a thin absorbing semiconductor layer inserted into larger bandgap semiconductor layers, all of which are in an optical cavity formed by mirrors above and below the absorber.

Suppression of Dark Current

An important aim in infrared detector development is minimizing dark current and its associated noise. Suppressing dark current of IR detectors, while maintaining the other beneficial characteristics of RCE PDs, is one of the objectives of embodiments disclosed herein. Thermal excitation (of electron-hole pairs), which starts the process of dark current generation, increases linearly with the volume of the semiconductor material, and also exponentially decreases with the magnitude of the semiconductor bandgap. Thus, dark current can be minimized by decreasing layer thickness and increasing the layers' bandgaps. Most conventional RCE PDs use two transparent layers and an absorbing layer that have only slightly different bandgaps, thus thermal generation of throughout all three layers is similar, i.e., the entire optical cavity generates dark current.

Figure 2:
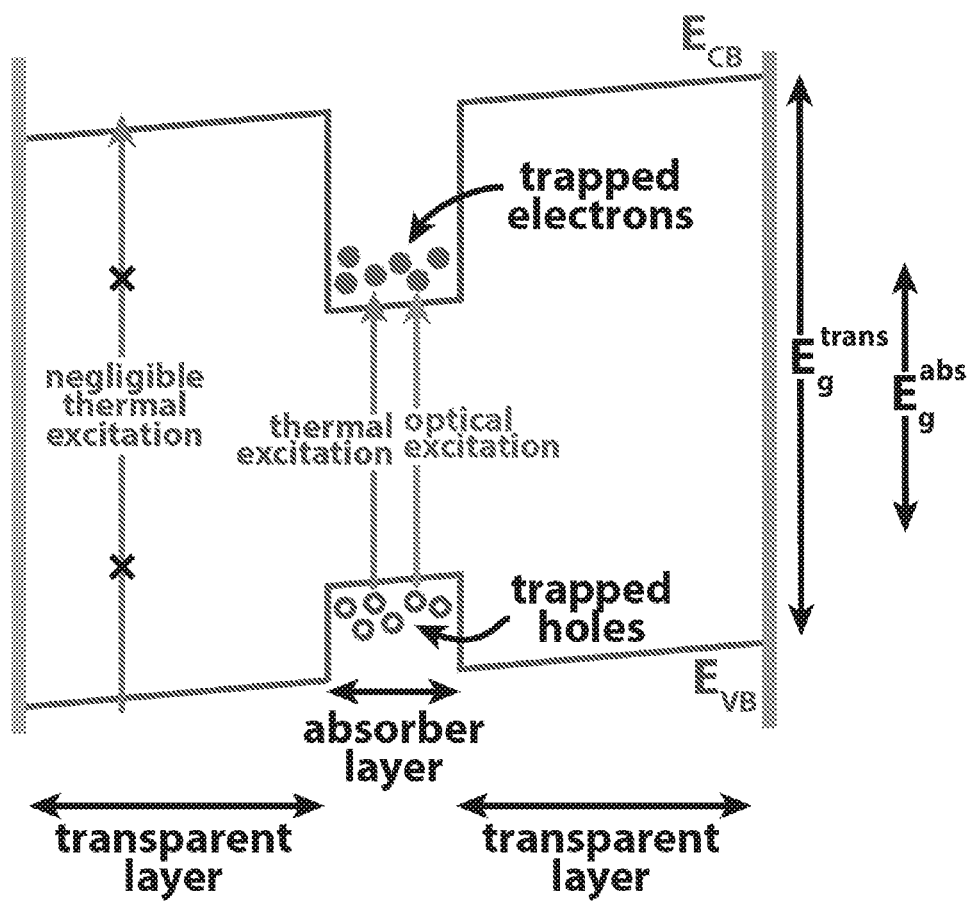
FIG. 2 is an example band diagram of an RCE PD for illustrating the reduction of dark current by increasing the bandgap of the transparent layers relative to that of the absorber. This design has opposite characteristics of the conventional design of FIG. 1, namely low dark current but poor photoresponse due to trapping of photogenerated carriers in the absorber.

To decrease the thermal generation of the transparent layer to negligible amounts, the bandgap was increased relative to that of the absorber. This limits the location of the generation of dark current to only the thin absorber layer. As shown in FIG. 2 for explanatory purposes, the large bandgaps of the transparent layers decrease their thermal generation to negligible amounts, so that the only substantial thermal generation is that which occurs in the absorber (conduction (CB) and valence (VB) band edges of the semiconductor material that make up the optical cavity are shown). Thus, instead of thermal generation occurring throughout the whole optical cavity, it mainly occurs in the thin absorber. In certain embodiments, the absorber may be thinner than the transparent layers by 10-1000 times, thus dark current is also reduced by this same factor. The advantage of increasing the bandgap as shown in FIG. 2 is the reduction of dark current. However this design is incomplete. The large difference in bandgaps between the transparent layers and the absorber results in deep potential wells that trap photogenerated carriers in the absorber layer. This carrier trapping will produce an unacceptably small photoresponse (unless large voltages are applied, which will cause another undesired effect: large dark current).

Avoiding Carrier Trapping

After increasing the transparent layers' bandgap to be significantly larger than that of the absorber, modification to the design interfaces between absorber and transparent layers is required to avoid carrier trapping. In one embodiment, the absorber has two interfaces with the two adjacent transparent layers. In one embodiment, the band profiles at one interface are designed to allow the escape of photoexcited electrons, while the band profile at the other interface must be designed to allow the escape of photoexcited holes.

Designing the band profiles to allow escape of carriers can be implemented by the elimination of the band offsets that confine the carriers. This is implemented by the various embodiments explained in further detail below for eliminating the confining band offsets, which would otherwise block the flow of photogenerated carriers.

Figure 3:
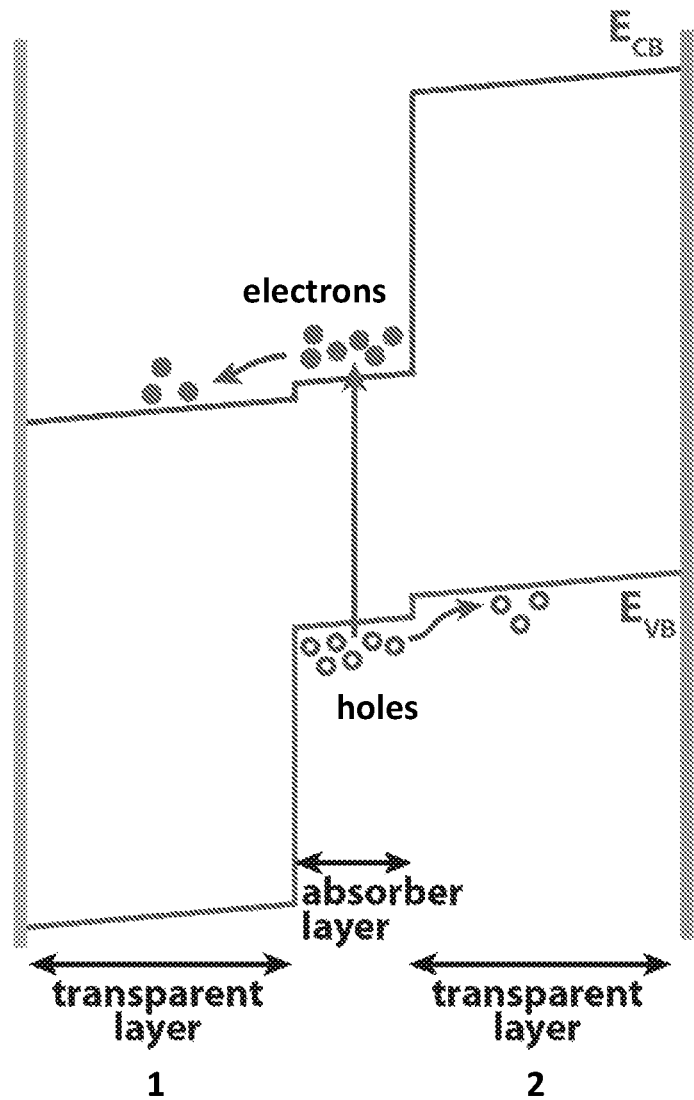
FIG. 3 is a band diagram of an RCE PD having large bandgap transparent layers to suppress dark current and band offsets that are designed to eliminate carrier trapping in the absorber layer according to an exemplary embodiment.

In one embodiment, pairs of semiconductor materials are chosen for the absorber and transparent layers, which have band alignments (sometimes also referred to as heterojunctions offsets, band offsets, or band discontinuities) that do not create barriers that trap carriers. In one embodiment, an infrared photodetector includes an absorber layer disposed between a first layer and second layer both of which have bandgap differences of at least 0.1 eV with respect to the absorber, where a conduction band edge energy of the first layer is less than or within 0.1 eV of a conduction band edge energy of the absorber layer, and a valence band edge energy of the second layer is greater than or within 0.1 eV of a valence band edge energy of the absorber layer. This approach can be applied for both interfaces of the absorber. Semiconductor materials are selected so that the two absorber interfaces have the necessary band offsets. In one embodiment, the first and second layers are substantially transparent, but can be semi-transparent according to another embodiment. As shown in FIG. 3, the material making up the transparent layer 1 through which electrons escape from the absorber is chosen to have a conduction band edge that is a lower energy or the same energy (i.e. not a larger energy) than that of the absorber. Similarly, for the other transparent layer 2, a different material than the first transparent layer should be chosen to have a valence band edge that is higher or at the same energy as that of the absorber, enabling the escape of holes. The large bandgap transparent layers suppress dark current, and band offsets are designed to eliminate carrier trapping in the absorber layer. In certain embodiments, the difference in bandgaps is >0.1 eV. In other embodiments, the difference in bandgaps may be a large as 2-3 eV.

Slopes of the conduction and valence band edges across the cavity and within the various layers can vary, according to various embodiments. In one embodiment, an electric field throughout an optical cavity of the infrared photodetector is substantially constant. In one embodiment, a slope of the conduction and valence band edges is substantially constant in each layer. In one embodiment, a slope of the conduction and valence band edges is substantially constant in the first layer and variable in the second layer. In one embodiment, a slope of one of the conduction and valence band edges transitions from substantially constant to variable. In one embodiment, a slope of the conduction and valence band edges is substantially the same in one layer and different in another layer. The embodiment shown in FIG. 3 is implemented in a structure where there is a nearly constant electric field (slope of the band edges) throughout the whole optical cavity. This can occur with intrinsic (undoped) material with an applied voltage. The photodetector can also be configured to act as a photodiode. In one embodiment, the first layer is one of an n-type layer and a p-type layer. In one embodiment, the absorber layer is one of an n-type layer and a p-type layer. In one embodiment, the second layer is one of an n-type layer and a p-type layer, and different than the first layer. In one embodiment, doping of the absorber layer is greater than doping of the second layer. Shown in FIG. 4, an embodiment is implemented in a pn junction structure having an n-type absorber and n- and p-transparent layers, with $E_F$ representing the Fermi energy of the electrons and holes. The doping of the n-absorber is larger than that of the p-transparent layer to produce most of the band bending in the p layer.

In one embodiment, each of the first and second layers and the absorber layer are made from at least one of a binary compound, a ternary compound, a quaternary compound, or a superlattice material. In certain embodiments, materials used for the transparent layers include one or more of the following: binary compounds, including for example InSb, InAs, GaSb, GaAs, InP, AlSb, PbTe, and PbSe; ternary compounds, including for example HgCdTe, HgCdSe, InAsSb, GaInAs, AlAsSb, GaAsSb, AlGaSb, AlInAs, PbSnTe, and PbSnSe; quaternary compounds, including for example GaInAsSb, AlInAsSb, and AlGaAsSb; and superlattice materials, including for example InAs(Sb)/GaSb, InAs/InAsSb, InGaAs/GaAsSb, and InAs(Sb)/Al(Ga)Sb. In certain embodiments, materials used for the absorber layers include one or more of the following: binary compounds, including for example GaSb, InAs, InSb, PbTe, PbSe; ternary compounds, including for example HgCdTe, HgCdSe, InAsSb, GaInAs, PbSnTe, PbSnSe; quaternary compounds, including for example GaInAsSb, AlInAsSb; and superlattice materials, including InAs(Sb)/GaSb, InGaAs/GaAsSb, InAs/InAsSb, InAs(Sb)/Al(Ga)Sb. In certain embodiments, since the absorber layers are thin, the compositions of the ternaries, quaternaries, and superlattices do not necessarily have to lattice-match the substrate. In certain embodiments, the mirrors are constructed of the same as in conventional RCE PDs. In certain embodiments, the mirrors are constructed by quarter wave stacks of semiconductor layers, dielectric coatings, metal coatings used alone or in conjunction with quarter wave stacks, deep gratings, or the top mirror is simply a semiconductor-air interface.

Figure 5:
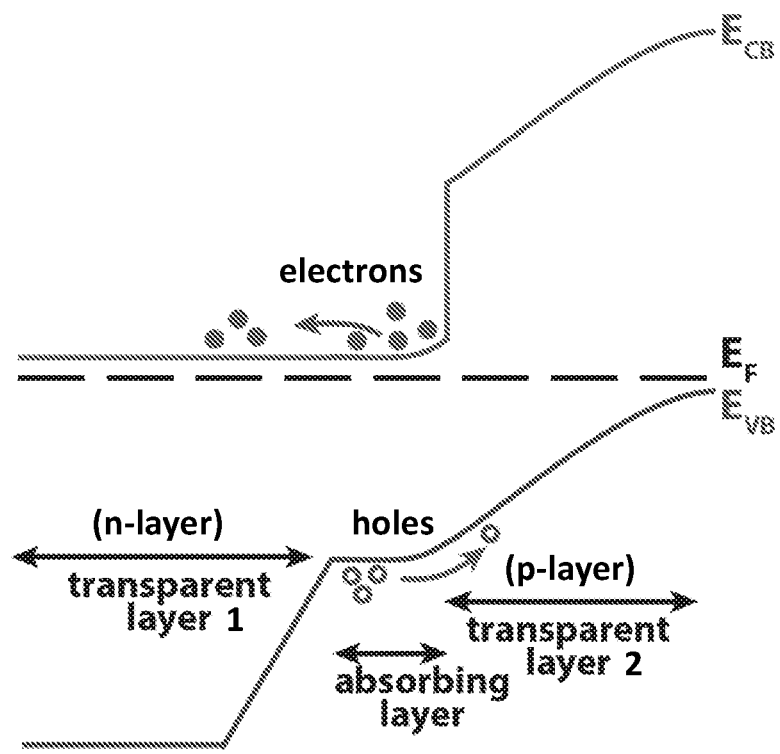
FIG. 5 is a band diagram of an RCE PD which uses a graded interface to allow the majority carriers to escape the absorber, and a non-blocking band offset to allow the minority carriers to escape, according to an exemplary embodiment.

In one embodiment, as shown in FIG. 5, a graded interface is implemented to allow the majority carriers to escape the absorber, and a non-blocking band offset is implemented to allow the minority carriers to escape is implemented. This embodiment uses a compositionally graded interface between the absorber and one of the transparent layers to enable the escape of the absorber's majority carrier. This approach is illustrated in the embodiment for the case of the absorber being doped n-type. The majority carriers in the absorber, electrons in this case, escape the absorber via an n-type compositionally graded interface between the absorber and the n-type transparent layer 1. The advantage of this approach is that no special band alignment is needed for the interface between the absorber and the n-type transparent layer 1, allowing more flexibility in choosing materials. The other interface of the absorber is engineered using band offset techniques described above, i.e. the band offsets of the n-absorber/p-transparent-layer 2 interface are chosen to be non-blocking to holes. This approach, shown in FIG. 5, implements a non-blocking band offset to allow the minority carriers to escape, and uses a graded interface to allow the majority carriers to escape the absorber. The n-type absorber shown in the embodiment of FIG. 5 employs a graded n-N heterojunctions to enable electron escape. This embodiment can also be implemented in the opposite polarity of that shown in FIG. 5. In this alternate embodiment, the absorber would be p-type, the majority carrier holes would escape the absorber through a compositionally graded p-P heterojunctions into the p-type transparent layer, the minority carrier holes would escape through an interface with a non-blocking band offset formed between the p-absorber and the n-transparent layer. The band diagram for this alternate polarity embodiment is obtained by turning FIG. 5 upside down, and interchanging the valence band and conduction band.

Figure 6:
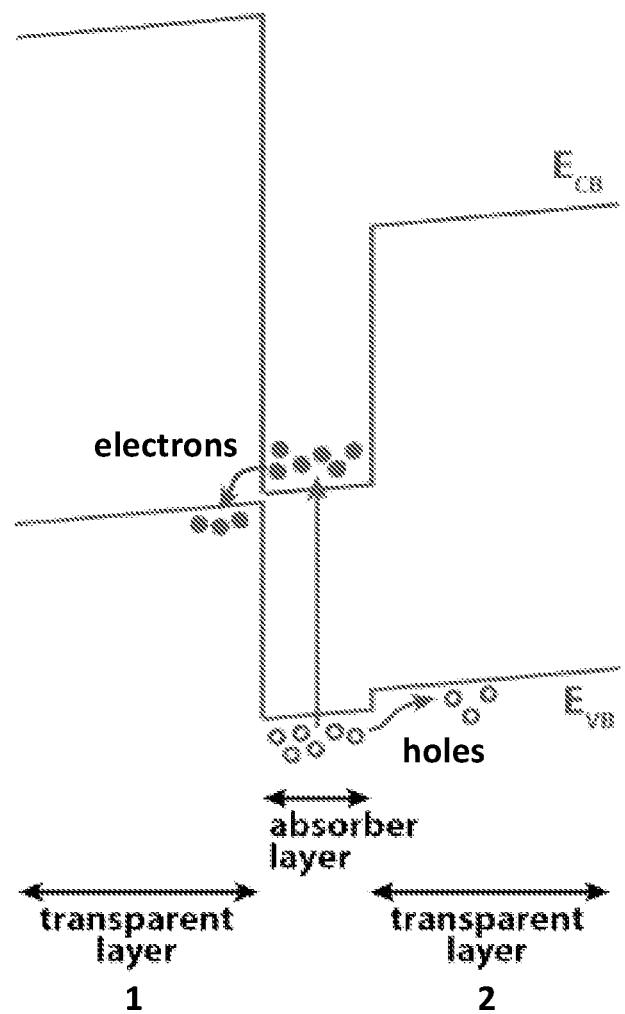
FIG. 6 is a band diagram of an RCE PD that allows the escape of photogenerated carriers by tunneling from one band of the absorber into the opposite band of the transparent layer, according to an exemplary embodiment.

In one embodiment, pairs of materials are chosen so that a photogenerated electron in the conduction band of the absorber can escape by tunneling into the valence band of the transparent layer. This requires that the absorber layer's conduction band nearly aligns with the transparent layers valence band (to enable the escape of electrons). In one embodiment, an infrared photodetector includes an absorber layer disposed between a first transparent layer and second transparent layer having a bandgap difference of at least 0.1 eV; where one of a conduction band and a valence band of the absorber layer is aligned with an opposite band of a transparent layer so that a photogenerated current carrier can tunnel from one band of the absorber layer into the opposite band of the transparent layer. In one embodiment, the absorber's current carrier is an electron. In one embodiment, the absorber's current carrier is a hole. In one embodiment, a conduction band of the absorber layer and a valence band of the first transparent layer are aligned so that the electron in the conduction band of the absorber layer can escape by tunneling into the valence band of the first transparent layer. In one embodiment, a valence band of the absorber layer and a conduction band of the second transparent layer are aligned so that the hole in the valence band of the absorber layer can escape by tunneling into the conduction band of second first transparent layer. As shown in the band diagram of FIG. 6, one embodiment allows the escape of photogenerated carriers by tunneling from one band of the absorber into the opposite band of the transparent layer. In certain embodiments, the two participating bands need to be aligned to within 0.1 eV or less so there is no significant energy barrier for the tunneling. FIG. 6 shows an embodiment that allows electrons to escape the absorber by tunneling (to the left) into the valence band of the transparent layer. In an alternative embodiment, a photogenerated hole in the valence band of the absorber can escape by tunneling into the conduction band of the transparent layer. This requires the absorber's valence band nearly aligns with the transparent layer's conduction band (to enable the escape of holes). In the alternate embodiment, the band opposite polarity structure is provided for hole escape, in which holes tunnel from the absorber's valence band into the conduction band of the transparent layer. The band diagram for this embodiment would be obtained by turning FIG. 6 upside down, and interchanging the valence band and conduction band.

Figure 4:
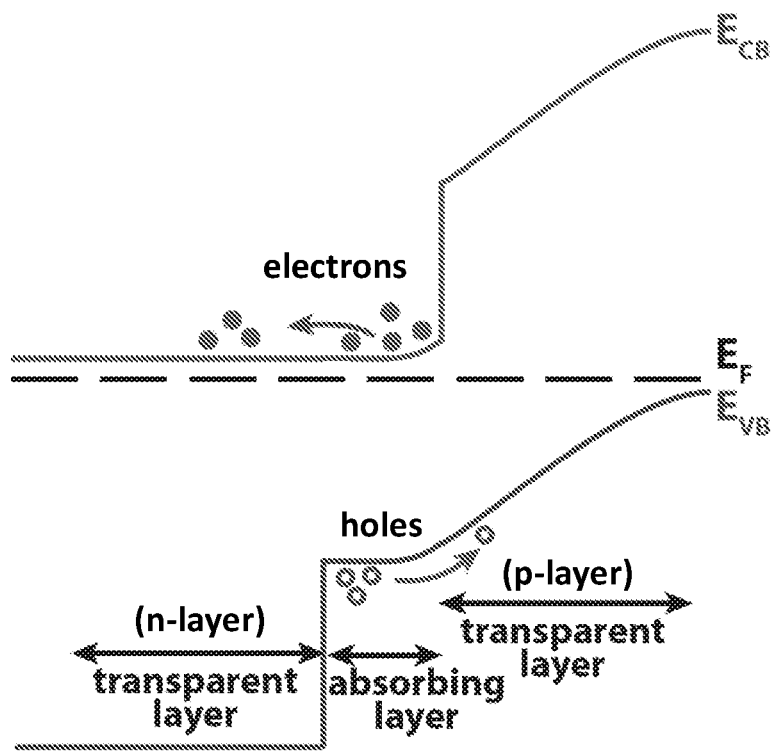
FIG. 4 is a band diagram of an RCE PD implemented with an n-type absorber, and n- and p-transparent layers according to an exemplary embodiment. The doping of the n-absorber is larger than that of the p-transparent layer to produce most of the band bending in the p layer.

As would be appreciated by those having ordinary skill in the art, alternative, but equivalent embodiments of FIGS. 4, 5, and 6 could be made by reversing the diagrams left-to-right. Also, alternative embodiments could be made by reversing the diagrams top-to-bottom (e.g. reversing n-type and p-type materials and changing conduction bands to valence bands). Thus, three equivalent embodiments are achieved for each of the figures, 4, 5 and 6, and are generated by: left-right reversed, top-bottom revered, and both left-right and top-bottom reversed.

Figure 7:
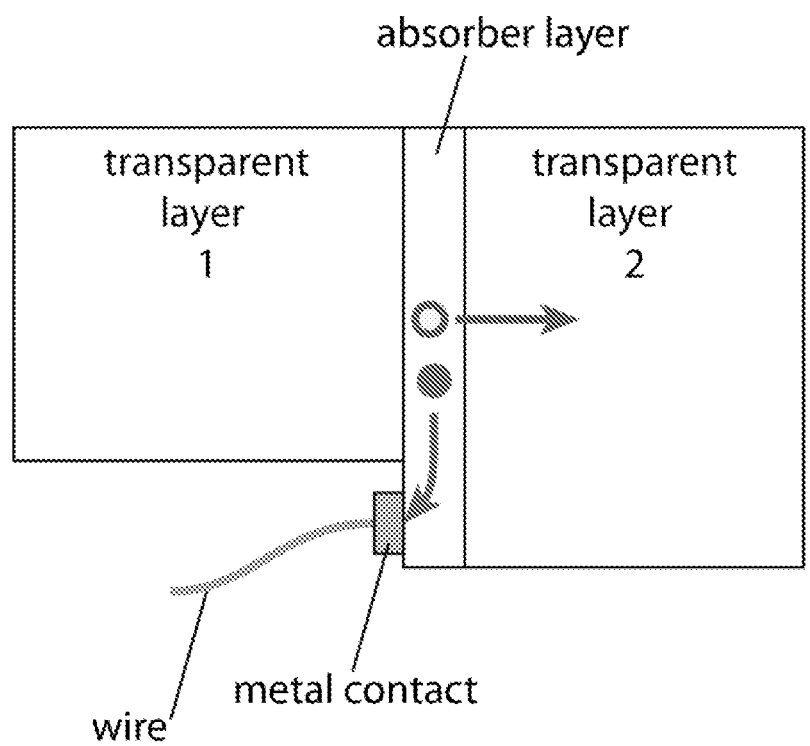
FIG. 7 is a diagram of an RCE PD that extracts an electron laterally out of the edge of the absorber layer.
Figure 8:
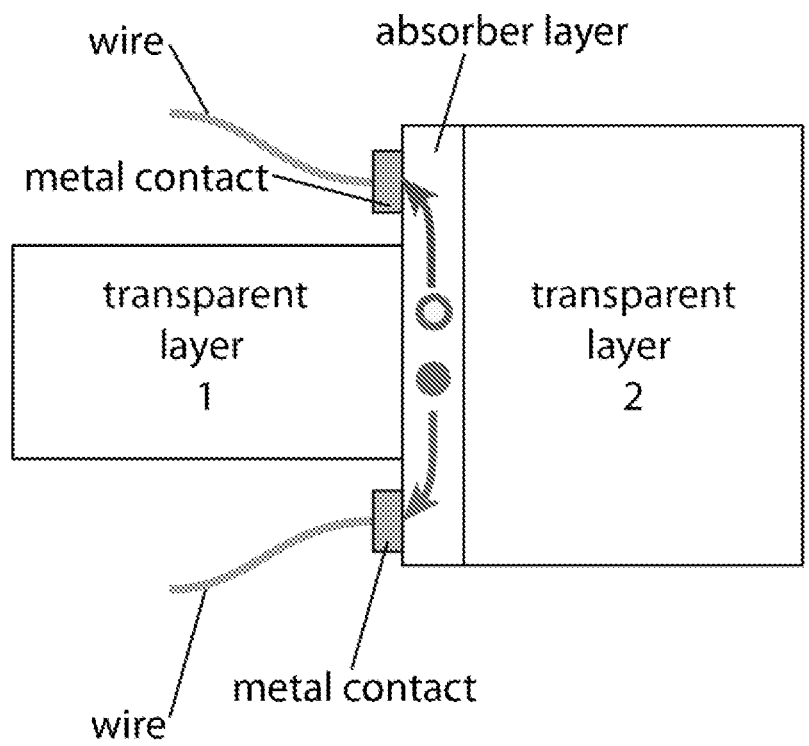
FIG. 8 is a diagram of an RCE PD that extracts both electrons and holes through opposite edges of the absorber.

The embodiments described above relate to extracting the photogenerated electrons and holes "through" the large bandgap transparent layers. An alternative design involves extracting one or both of the electrons and holes "laterally" out the edge of the absorber layer. In one embodiment, with reference now to FIG. 7, a "sandwich" structure is created by configuring two transparent layers with the absorber layer in the middle (as previously described above), then partially etching away one of the transparent layers to expose the edge(s) of the absorber, and make electrical contact to the exposed absorber edge. As shown in FIG. 7, this approach could be implemented for extracting just one of the two types of current carriers (shown below extracting the electron through the absorber's edge, but an alternative design could extract just the hole through the absorber edge), and the other carrier is extracted through the transparent layer with one of the approaches described above. Alternatively, as shown in FIG. 8, the approach could be used to extract both electrons and holes through opposite edges of the absorber.

Advantageously, embodiments of the infrared semiconductor photodetector devices disclosed herein have high efficiency, low dark current (which produces low noise), and narrow spectral linewidth operation. At wavelengths longer than 2 microns, dark current is minimized. At these longer wavelengths, designs according to the embodiments disclosed herein achieve both low dark current and a high photoresponse, which was not accomplished by conventional RCE PDs.

The disclosures of each and every patent, patent application, and publication cited herein are hereby incorporated herein by reference in their entirety. While devices, systems and methods been disclosed with reference to specific embodiments, it is apparent that other embodiments and variations may be devised by others skilled in the art without departing from the true spirit and scope.

What is claimed is:

1. An infrared photodetector comprising:
an absorber layer disposed between a first layer and second layer each having a bandgap difference with respect to the absorber of at least 0.1 eV;
wherein conduction and valence band edges are configured to have a barrier-free band profile to allow escape of photogenerated electrons or holes from the absorber layer;
wherein the first layer is one of an n-type layer and a p-type layer;
wherein the absorber layer is one of an n-type layer and a p-type layer;
wherein the second layer is one of an n-type layer and a p-type layer, and different than the first layer; and
wherein doping of the absorber layer is greater than doping of the second layer.

2. The infrared photodetector of claim 1, wherein the first and second layers are substantially transparent.

3. The infrared photodetector of claim 1, wherein an electric field throughout an optical cavity of the infrared photodetector is substantially constant.

4. The infrared photodetector of claim 1, wherein each of the first and second layers and the absorber layer are made from at least one of a binary compound, a ternary compound, a quaternary compound, or a superlattice material.

5. The infrared photodetector of claim 1, wherein an interface between the absorber layer and one of the first and second layers is compositionally graded.

6. The infrared photodetector of claim 1, wherein a conduction band edge energy of the first layer is less than or within 0.1 eV of a conduction band edge energy of the absorber layer.

7. The infrared photodetector of claim 1, wherein a valence band edge energy of the second layer is greater than or within 0.1 eV of a valence band edge energy of the absorber layer.

8. An infrared photodetector comprising:
an absorber layer disposed between a first transparent layer and second transparent layer each having a bandgap difference with respect to the absorber of at least 0.1 eV;
wherein either of a conduction band or a valence band of the absorber layer is configured to align with an opposite band of the first transparent layer or the second transparent layer so that a photogenerated current carrier can escape the absorber layer by moving without barrier from the conduction band or the valence band of the absorber layer directly into the opposite band of one of the first or second transparent layer.

9. The infrared photodetector of claim 8, wherein the current carrier is an electron.

10. The infrared photodetector of claim 9, wherein a conduction band of the absorber layer and a valence band of the first transparent layer are aligned so that the electron in the conduction band of the absorber layer can escape by tunneling into the valence band of the first transparent layer.

11. The infrared photodetector of claim 8, wherein the current carrier is a hole.

12. The infrared photodetector of claim 11, wherein a valence band of the absorber layer and a conduction band of the second transparent layer are aligned so that the hole in the valence band of the absorber layer can escape by tunneling into the conduction band of second transparent layer.

13. An infrared photodetector comprising:
an absorber layer disposed between a first layer and second layer each having a bandgap difference with respect to the absorber of at least 0.1 eV; and
a first metal contact attached directly to a first exposed edge of the absorber layer and configured to allow a barrier-free escape of photogenerated electrons or holes from the absorber layer directly to the first metal contact;
wherein a conduction band edge energy of the first layer is less than or within 0.1 eV of a conduction band edge energy of the absorber layer, or a valence band edge energy of the second layer is greater than or within 0.1 eV of a valence band edge energy of the absorber layer.

14. The infrared photodetector of claim 13, wherein the photodetector is configured to extract at least one of an electron or a hole laterally out of the absorber layer.

15. The infrared photodetector of claim 13 further comprising: a second metal contact attached to a second exposed edge of the absorber layer, wherein the second exposed edge opposes the first opposed edge.

16. An infrared photodetector comprising:
an absorber layer disposed between a first layer and second layer each having a bandgap difference with respect to the absorber of at least 0.1 eV; and
a first metal contact attached directly to a first exposed edge of the absorber layer and configured to allow a barrier-free escape of photogenerated electrons or holes from the absorber layer directly to the first metal contact;
wherein conduction and valence band edges are configured to have a barrier-free band profile to allow escape of photogenerated electrons or holes from the absorber layer.

* * * * *